(12) United States Patent
Liu et al.

(10) Patent No.: US 9,045,328 B2
(45) Date of Patent: Jun. 2, 2015

(54) METHOD FOR WAFER-LEVEL SURFACE MICROMACHINING TO REDUCE STICTION

(75) Inventors: Fang Liu, Woburn, MA (US); Kuang Yang, Newton, MA (US)

(73) Assignee: Analog Devices, Inc., Norwood, MA (US)

( * ) Notice: Subject to any disclaimer, the term of this patent is extended or adjusted under 35 U.S.C. 154(b) by 650 days.

(21) Appl. No.: 13/331,582

(22) Filed: Dec. 20, 2011

(65) Prior Publication Data

US 2013/0157005 A1    Jun. 20, 2013

(51) Int. Cl.
*B81B 3/00*    (2006.01)

(52) U.S. Cl.
CPC .......... *B81B 3/001* (2013.01); *Y10T 428/24355* (2013.01); *Y10T 428/24521* (2013.01)

(58) Field of Classification Search
CPC  B81B 3/001; B81B 3/0005; B81B 2201/016; H01L 41/094; B81C 2201/112; B81C 1/0096
See application file for complete search history.

(56) References Cited

U.S. PATENT DOCUMENTS

| 5,429,708 | A | 7/1995 | Linford et al. ............... 216/66 |
| 5,597,767 | A | 1/1997 | Mignardi et al. ............. 437/227 |
| 5,662,771 | A | 9/1997 | Stouppe ....................... 438/52 |
| 5,694,740 | A | 12/1997 | Martin et al. .................. 53/431 |
| 6,859,542 | B2 | 2/2005 | Johannsen et al. ............ 381/174 |
| 6,953,977 | B2 | 10/2005 | Mlcak et al. ................. 257/414 |
| 7,364,942 | B2 | 4/2008 | Martin ........................ 438/106 |
| 2004/0124497 | A1* | 7/2004 | Rottenberg et al. ........... 257/532 |
| 2011/0073859 | A1 | 3/2011 | Chen et al. ................... 257/53 |

FOREIGN PATENT DOCUMENTS

CN    1167342 A    12/1997

OTHER PUBLICATIONS

Wang, K., et al., "Stable SuperHydrophobic Composite Coatings Made From an Aqueous Dispersion of Carbon Nanotubes and a Fluoropolymer," *Carbon*, vol. 49, pp. 1769-1774, 2011 [1522315].
Ramé-Hart, Information on Contract Angle (Ramé-Hart) 1961-2011 50$^{th}$ Anniversary, 4 pages, printed 2011.
Sarro, P., "Silicon Carbide as a New MEMS Technology," *Sensors and Actuators* 82 (2000), pp. 210-218.
Xiu, Y., et al., "A Novel Method to Prepare Superhydrophobic, Self-Cleaning and Transparent Coatings for Biomedical Application," IEEE, Electronic Components and Technology Conference, pp. 1218-1233, 2007.
Xiu, Y., et al., "Eutectic Liquid in Sol-Gel Process for Superhydrophobic Silica Thin Films—Antistiction of MEMS Devices," *IEEE Advanced Packaging Materials Symposium*, 8 pages, 2007.

(Continued)

*Primary Examiner* — Duy Deo
*Assistant Examiner* — Erin Bergner
(74) *Attorney, Agent, or Firm* — Sunstein Kann Murphy & Timbers LLP

(57) ABSTRACT

An array of microbumps with a layer or coating of non-superhydrophobic material yields a superhydrophobic surface, and may also have a contact angle hysteresis of 15 degrees or less. A surface with such an array may therefore be rendered superhydrophobic even though the surface structure and materials are not, by themselves, superhydrophobic.

4 Claims, 13 Drawing Sheets

(56) References Cited

OTHER PUBLICATIONS

Bhushan, B., et al., "Wetting Study of Patterned Surfaces for Superhydrophobicity," *ScienceDirect* Ultramicroscopy 107 (pp. 1033-1041, 2007).

Authorized Officer: Philippe Foussier Notification of Transmittal of the International Search Report and the Written Opinion of the International Searching Authority, or the Declaration, PCT/US2012/069506, 13 pages, Apr. 26, 2013.

* cited by examiner

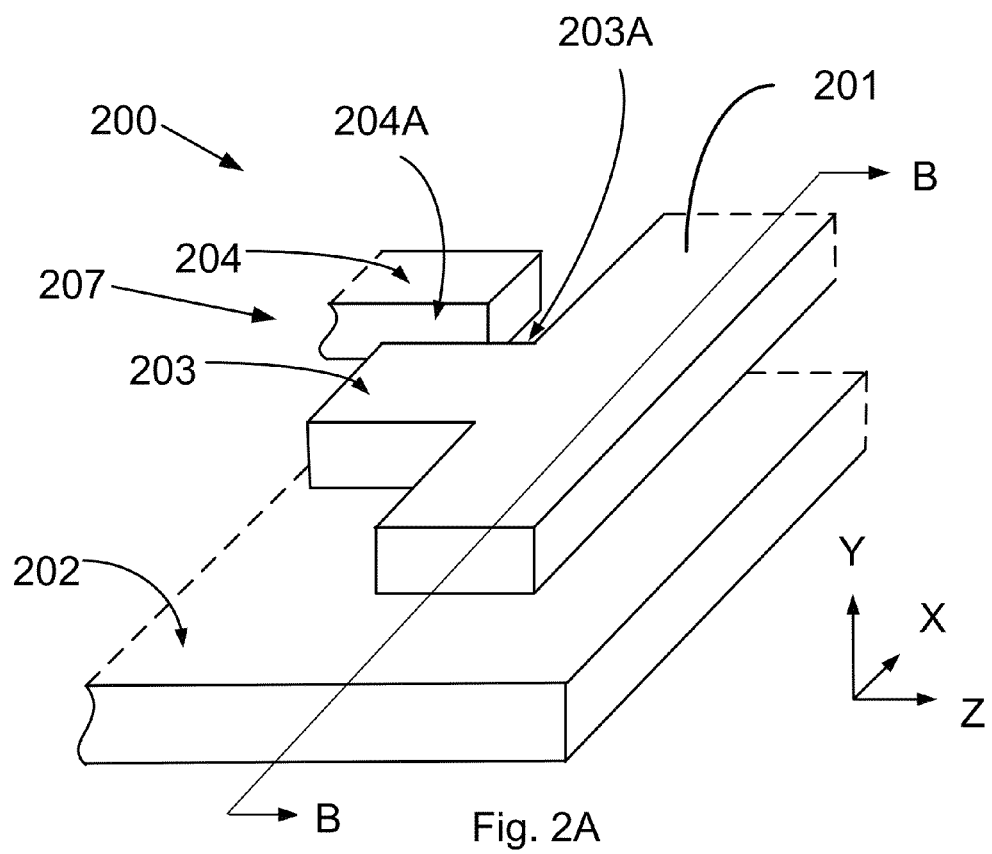
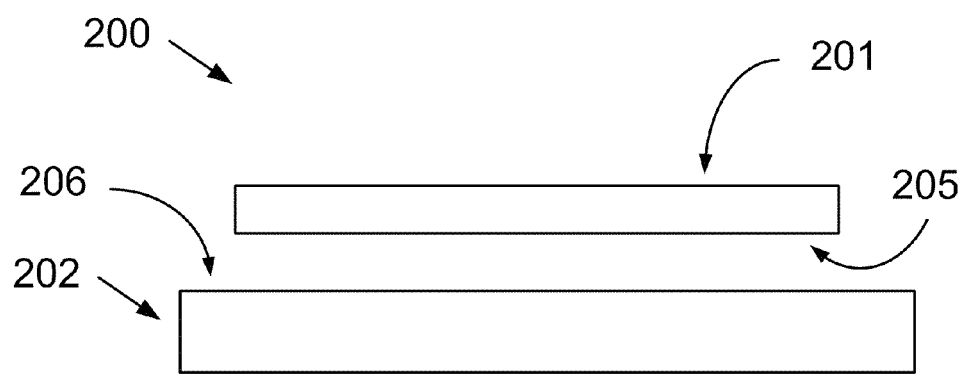

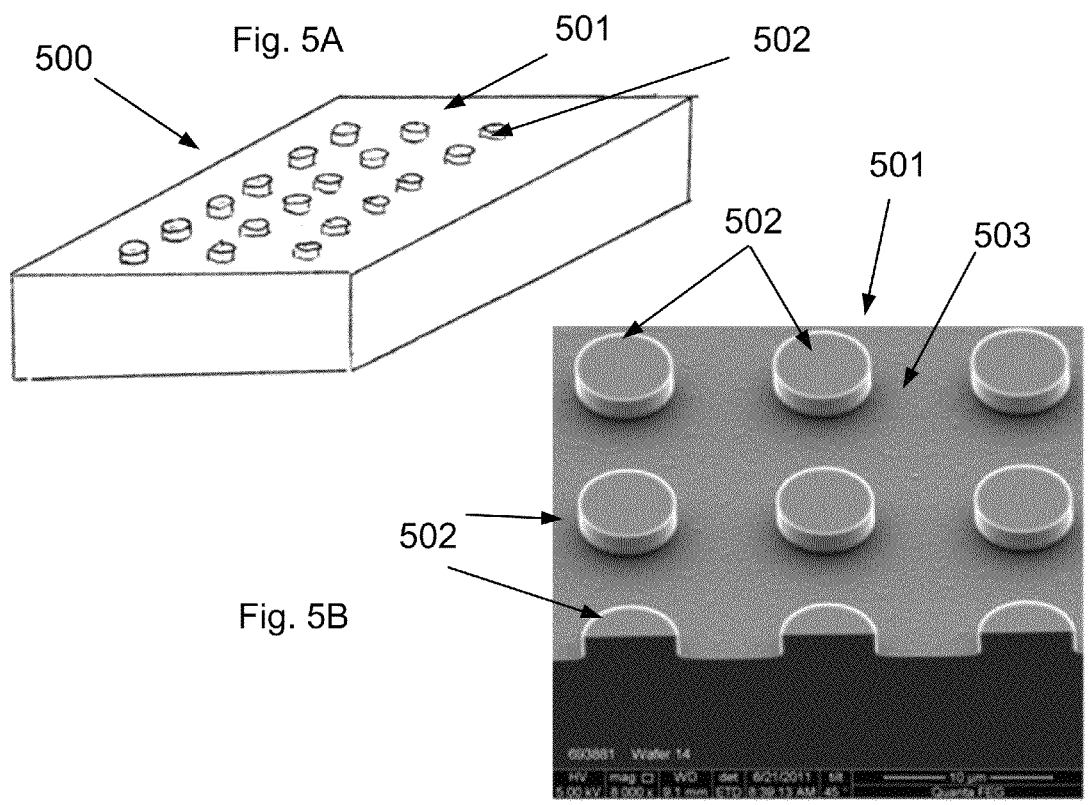
Fig. 5A
Fig. 5B
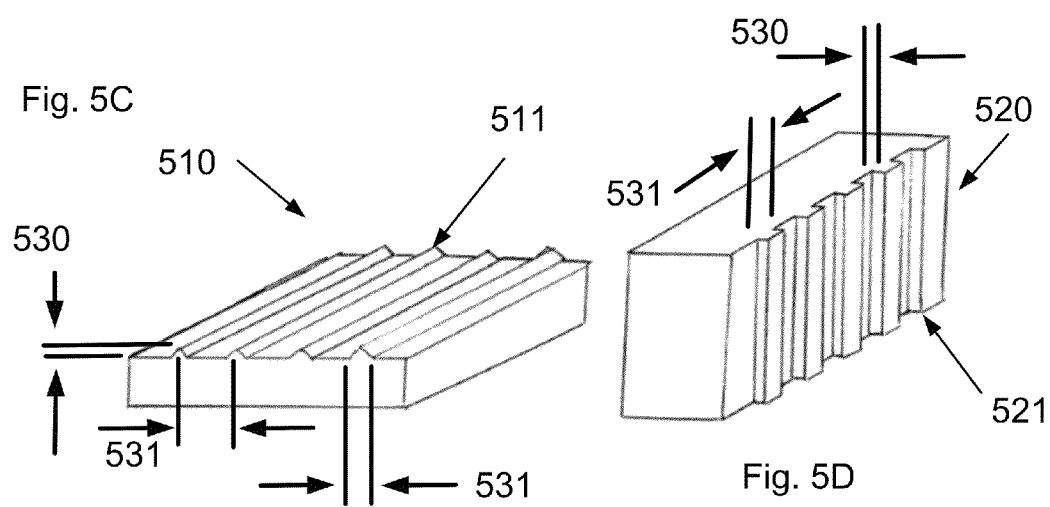
Fig. 5C
Fig. 5D

METHOD FOR WAFER-LEVEL SURFACE MICROMACHINING TO REDUCE STICTION

TECHNICAL FIELD

The present invention relates to micromachined devices, and more particularly to methods for fabricating micromachined devices.

BACKGROUND ART

A micromachined device typically includes a substrate and a movable component suspended relative to the substrate. The substrate and movable component face each other across a gap, and have dimensions that are large relative to the gap.

In normal operation, the substrate and movable component do not come into contact. However, if the moveable component approaches the substrate, the opposing (or "facing") surfaces may adhere to one another, in a phenomenon commonly known as "stiction."

Stiction is a dominant failure mechanism in micromachined devices, and can arise in a variety of ways. Stiction may arise, for example, when interfacial forces between two opposing faces of a micromachined device exceed the restoring forces of the suspension system. The stiction forces may include capillary forces, chemical bonding, electrostatic forces, and van der Waals forces.

Stiction has been addressed by providing standoffs on a surface of a MEMS device, such as in U.S. Pat. No. 5,662,771 for example, or by coating a surface of a MEMS device with a coating, such as in U.S. Pat. No. 7,364,942, for example.

The reliability of MEMS devices may also suffer from corrosion or contamination. Corrosion or contamination may occur if the MEMS device is exposed to the ambient environment, such as a humid environment for example, as might happen if the packaging or encapsulation of the device fails. Indeed, some MEMS devices are exposed to their environment in the normal course of their operation. For example, microphones and pressure sensors may be exposed to the ambient atmosphere. Particles or other contaminants may enter the MEMS device and degrade device performance, or even cause device failure.

SUMMARY OF THE EMBODIMENTS

A first embodiment provides a micromachined device having a superhydrophobic surface that includes a surface treatment of a non-superhydrophobic material. The micromachined device includes a substrate having a first surface, and a movable mass having an opposing surface, where the opposing surface is separated from the first surface by a gap. In addition, at least one of the first surface and the opposing surface includes an array of bumps extending into the gap. The array includes a multiplicity of bumps having a pitch of between 0.5 microns and 30 microns, and each bump has a height of at least 0.2 microns and width of at least 0.5 microns. Further, a layer of non-superhydrophobic material covers the array.

In some embodiments, each bump has a height of not more than 8 microns, and a width of not more than 20 microns. In some embodiments, the array has bumps of uniform dimensions. In some embodiments, the array has bumps of non-uniform dimensions.

In some embodiments, the spacing of the bumps is uniform. In some embodiments, the spacing of the bumps is non-uniform.

In other embodiments, each of the first surface and the opposing surface include a superhydrophobic array.

In some embodiments, the non-superhydrophobic material includes fluorine, while in other embodiments the non-superhydrophobic material includes chlorine, or methane. In some embodiments, the non-superhydrophobic material includes a one of a perflourodecyltrichlorosilane coating or a phenyl-based coating.

In some embodiments, at least a portion of the covered array is superhydrophobic.

In another embodiment, a method of forming a superhydrophobic surface includes the steps of providing a surface; providing an array of microbumps on the surface, wherein the array by itself is not superhydrophobic, and wherein the array includes a multiplicity of microbumps having a pitch of between 0.5 microns and 30 microns, and each bump has a height of at least 0.2 microns and width of at least 0.5 microns. The method also includes the step of coating the array of microbumps with a non-superhydrophobic material, wherein the coating renders the array is superhydrophobic.

In some embodiments, the step of coating the array of microbumps with a non-superhydrophobic material includes coating the array of microbumps with a material selected from the group of fluorine, chlorine, methane, a phenyl-based material, and a perflourodecyltrichlorosilane material.

In another embodiment, a method of fabricating a micromachined device having a superhydrophobic surface includes the steps of providing a substrate having a first surface; adding a sacrificial layer on the first surface such that the sacrificial layer has an exposed surface; etching an array of cavities into the exposed surface of the sacrificial layer; depositing a low surface-free-energy layer to the array of cavities, the low surface-free-energy material lining but not filling the cavities in the array of cavities such that the cavities are lined cavities; depositing a mass layer on the low surface-free-energy layer, such that the sacrificial layer and the low surface-free-energy layer are sandwiched between the substrate and an opposing surface of the mass layer, such that the mass layer occupies the lined cavities and forms bumps; and removing the sacrificial layer, wherein the bumps protrude from the opposing surface of the mass layer in the direction of the substrate, and wherein the array has a contact angle of at least 140 degrees and a contact angle hysteresis of less than 15 degrees.

In some embodiments, the step of depositing a low surface-free-energy layer to the sacrificial layer includes depositing a material selected from the group of fluorine, chlorine, methane, a phenyl-based material, and a perflourodecyltrichlorosilane material.

Another embodiment provides a method of fabricating a micromachined device having a superhydrophobic surface, including the steps of providing a substrate having a first surface; providing an array of bumps on the first surface; adding a low surface-free-energy layer to the array, such that the low surface-free-energy layer coats the bumps but does not fill the space between the bumps; adding a sacrificial layer on the low surface-free-energy layer, the sacrificial layer having an exposed surface; depositing a mass layer on the exposed surface of the sacrificial layer such that the sacrificial layer is sandwiched between the substrate and an opposing surface of the mass layer; and removing the sacrificial layer, thereby exposing the coated array, wherein the bumps of the array protrude from the substrate in the direction of the opposing surface of the mass layer, and wherein the array has a contact angle of at least 140 degrees and a contact angle hysteresis of less than 15 degrees.

In some embodiments, the step of providing an array of bumps on the first surface includes providing an array of bumps in which the array includes a multiplicity of bumps having a pitch of between 0.5 microns and 30 microns, and each bump having a height of at least 0.2 microns and width of at least 0.5 microns.

In some embodiments, the step of adding a low surface-free-energy layer to the array includes adding a material selected from the group of fluorine, chlorine, methane, a phenyl-based material, and a perflourodecyltrichlorosilane material.

In some embodiments, the method also includes the following steps, before depositing a mass layer on the exposed surface of the sacrificial layer: etching an array of cavities into the exposed surface of the sacrificial layer; depositing a second layer of low surface-free-energy material to the array of cavities, such that the low surface-free-energy material lines but does not fill the cavities in the array of cavities, such that the cavities are lined cavities, wherein depositing the mass layer sandwiches the sacrificial layer and the second low surface-free-energy layer between the substrate and an opposing surface of the mass layer, the mass layer occupying the lined cavities and forming bumps, and wherein removing the sacrificial layer exposes an array of bumps coated with the second low surface-free-energy material.

BRIEF DESCRIPTION OF THE DRAWINGS

The foregoing features of embodiments will be more readily understood by reference to the following detailed description, taken with reference to the accompanying drawings, in which:

FIGS. 2A and 2B schematically illustrate a micromachined accelerometer;

FIGS. 5A, 5C and 5D schematically illustrate surfaces of various embodiments, FIG. 5B is a photograph of a microbump array;

DETAILED DESCRIPTION OF SPECIFIC EMBODIMENTS

Various embodiments provide micromachined devices with superhydrophobic surfaces, and methods of fabricating micromachined devices with superhydrophobic surfaces, without the use of a superhydrophobic coating. Such surfaces and devices are less prone to stiction than other devices, and/or may have enhanced self-cleaning properties. As such, a superhydrophobic MEMS surface may be created without a superhydrophobic coating.

Figure 1A:
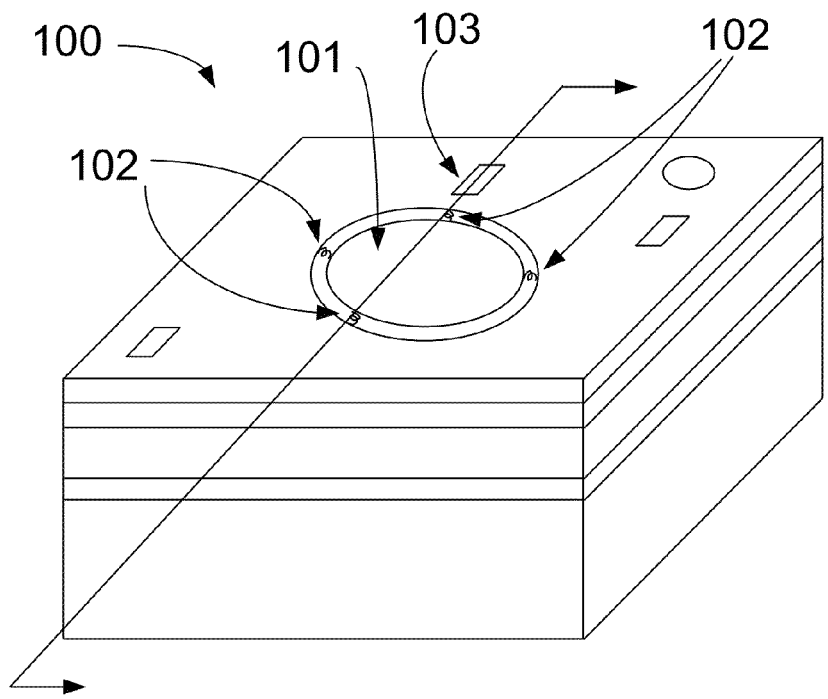
FIGS. 1A and 1B schematically illustrate a micromachined microphone.
Figure 1B:
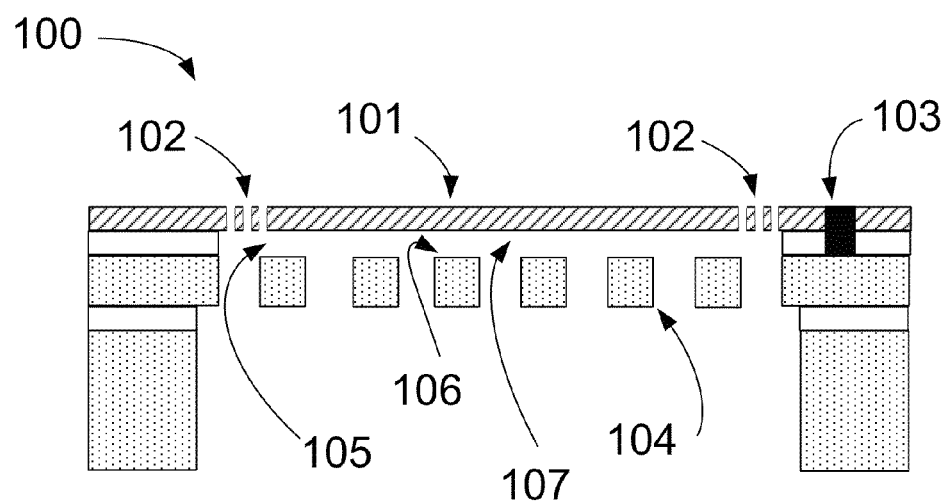

A variety of micromachined devices may benefit from various embodiments. For example, FIG. 1A schematically illustrates a perspective view of micromachined microphone 100 with a diaphragm 101 that may be susceptible to stiction or other problems, while FIG. 1B schematically illustrates a cross-section of the microphone 100. The diaphragm 101 is suspended by springs 102 above a backplate 104. The diaphragm 101 and backplate 104 are both conductive, but are electrically isolated from each other. As such, the diaphragm 101 and backplate 104 form a capacitor.

More specifically, the diaphragm 101 and backplate 104 form a variable capacitor. In operation, the diaphragm vibrates in response to incident sound waves, thus changing the gap 105 between the diaphragm 101 and backplate 105. Among other things, this means that, as the gap 105 narrows, the diaphragm 101 approaches the backplate 104. The capacitance of the variable capacitor formed by the diaphragm 101 and backplate 104 therefore varies with the impinging sound waves. The variable capacitance can be electronically processed to produce an electrical signal representing the impinging sound waves, in ways well known in the art.

In some circumstances, the diaphragm 101 my stick to the backplate 104, possibly damaging the diaphragm 101, and/or distorting the electronic signal. For example, the diaphragm 101 may move towards the backplate 104 and get stuck to the backplate during the packaging of the microphone 100, or when the microphone is shipped to a customer, or installed into a system. In addition, contaminants between the diaphragm and the backplate, such as moisture one on or both of the facing surfaces 106 and 107 of the backplate 104 and diaphragm 101 may cause or facilitate stiction, or otherwise degrade microphone performance.

To mitigate the risk and severity of stiction, some embodiments have one or more superhydrophobic surfaces, including both structural features and surface coatings, as described in more detail below. For example, either the facing surface 107 of the diaphragm 101, or the surface 106 of the backplate 104, or both, may be superhydrophobic.

FIG. 2A schematically illustrates a portion of a micromachined accelerometer 200, in which a mass (or "beam") 201 is suspended by springs (not shown) above a substrate 202, while FIG. 2B shows a cross-section of accelerometer 200 along line B-B. When the accelerometer 200 is not subject to an acceleration, the beam 201 remains suspended above the substrate 202, and does not move relative to the substrate 202. However, when the substrate 202 is subjected to an acceleration, for example in the +X direction, the inertia of the beam 201 causes a displacement of the beam 201 relative to the substrate 202. A finger 203 on the beam 201 forms a variable capacitor across gap 207 with a counterpart finger 204 on the substrate 202. The capacitance varies when the beam 201 moves relative to the substrate 202. The variable capacitance can be electronically processed to produce an electrical signal representing the displacement of the beam, and therefore representing the acceleration.

Ideally, the beam 201 remains suspended above the substrate 202 at all times; in other words, the motion of the beam 201 relative to the substrate 202 occurs within a plane above, and parallel to, the substrate.

In some circumstances, however, the beam 201 may move towards the substrate 202 and become stuck. For example, the bottom surface 205 of the beam 201 may become stuck to the opposing surface 206 of the substrate 201 when the accelerometer 200 is subject to an acceleration with a large acceleration vector normal to the plane, or during the packaging of the accelerometer, or when accelerometer is installed on a circuit board. In addition, contaminants between the beam 201 and substrate 202, such as moisture on one or both of the facing surfaces 205 and 206 of the beam 201 and substrate 202, may cause stiction or otherwise degrade performance of the accelerometer.

Alternately, the facing surface 204A of one finger 204 may stick to the facing surface 203A of movable finger 203. In such a case, the sticking surfaces are substantially perpendicular to the surface 206 of the substrate 202.

One approach to addressing stiction in a micromachined device involves preparing at least one surface of the micromachined device so that the surface is less susceptible to stiction than it would otherwise be. Some embodiments have one or more superhydrophobic surfaces.

The inventors have discovered that the combination of a microbump array and a low surface-free-energy layer together provide a superhydrophobic surface. For purposes of this description and the accompanying claims, the following terms shall have the meanings indicated, unless the context otherwise requires:

The term "hydrophobic" refers to the tendency of a surface to repel water, or resist the spread of water across the surface. The hydrophobic quality of a surface is commonly expressed in terms of "contact angle."

Figure 4A:
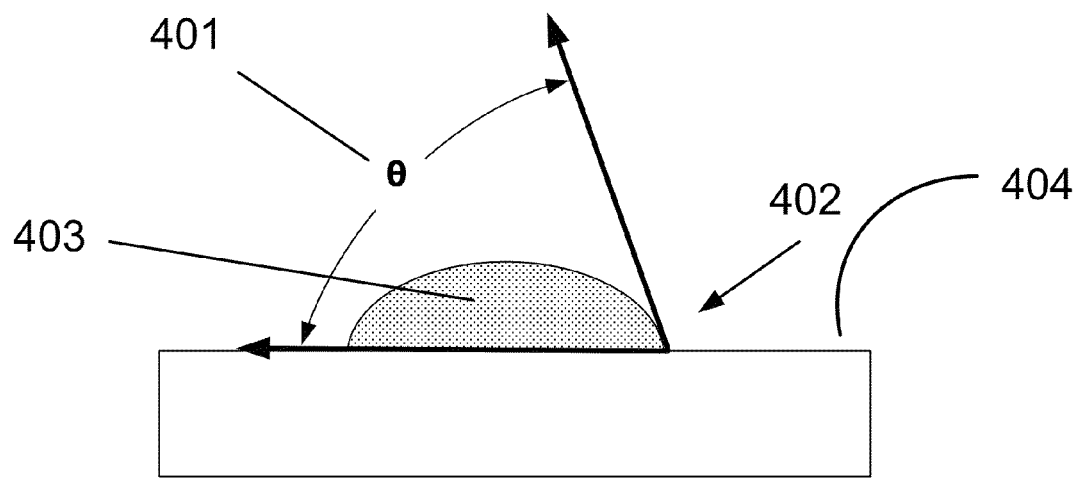
FIGS. 4A and 4B schematically illustrate a liquid body on a level and a tilted surface, respectively.

The term "contact angle" refers to the angle formed at the interface of water and gas with a surface. Specifically, "contact angle" is the angle 401 formed between the interface of the liquid (403) and ambient gas, and the surface (404)/liquid (403) interface (402), as schematically illustrated in FIG. 4A.

Figure 4B:
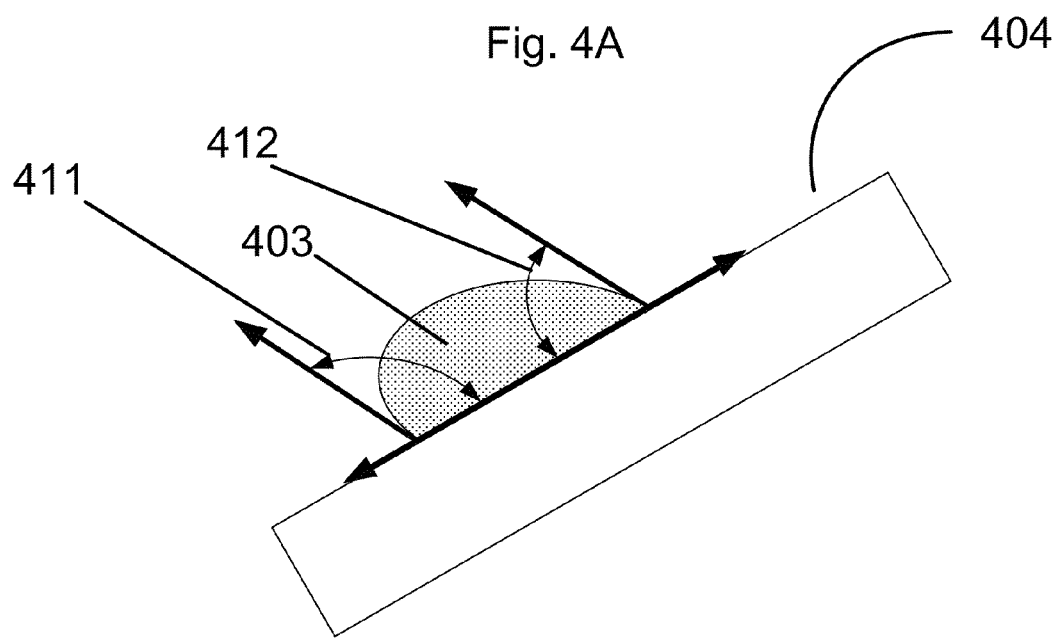

If the hydrophobic surface 404 is tilted, the water 403 may form different contact angles at its downhill and uphill interfaces, as schematically illustrated in FIG. 4B. The two contact angles may be known as the "advancing contact angle" 411 and the "receding contact angle" 412, respectively.

The term "contact angle hysteresis" means the difference between the advancing contact angle 411 and the receding contact angle 412. The term "Low Contact Angle Hysteresis" means a contact angle hysteresis that is less than 15 degrees. A surface with a low contact angle hysteresis has a "self-cleaning" property, in that such a surface resists retaining liquids and other contaminants, thereby reducing the likelihood of corrosion, for example.

The term "superhydrophobic" when used to describe a surface refers to the quality of a surface that has a contact angle of 140 degrees or more. Indeed some embodiments may have a contact angle of 150 degrees, or 160 degrees or more. In some embodiments, a superhydrophobic surface may also have and a low contact angle hysteresis.

If a planar surface has a covering layer or coating of material, but the surface is not superhydrophobic, then that material is a non-superhydrophobic material. In other words, the term "non-superhydrophobic" when used to describe a material means that it is a material that does not produce a superhydrophobic surface when applied to a planar surface.

Taking a MEMS accelerometer as an example, either the facing surface 205 of the beam 201, or the surface 206 of the substrate 202, or both, may include superhydrophobic surfaces. Of course, surfaces of the types described below could also be applied to other micromachined devices, such as microphones or gyroscopes for example.

Embodiments of surface features include both a microbump array and a low surface-free-energy layer or coating on the microbump array. Generally, a surface with a microbump array, but without the low surface-free-energy layer would not, by itself, be superhydrophobic. Similarly, a surface with the low surface-free-energy layer, but without the microbump array, would not, by itself, be superhydrophobic. In other words, the inventors have discovered a way to make a superhydrophobic surface without using superhydrophobic materials.

Various embodiments of microbump arrays are schematically illustrated in FIGS. 5A, 5B and 5D, and FIG. 5C is a photograph of a microbump array. Some embodiments 500 have an array 501 of microbumps 502, such as those schematically illustrated in FIG. 5A and photographed in FIG. 5B. These microbumps 502 are cylindrical shapes standing proud of the surface 503, and each microbump is substantially the same size and shape as the other microbumps in the array. For example, the microbumps 502 may be 0.2 to 8 microns in height and 0.5 to 20 microns in diameter, and have a pitch of 0.5 to 30 microns. Although the microbump arrays illustrated in these figures are uniform in terms of the pattern of microbumps, some microbump arrays may have non-uniform dimensions. For example, in some embodiments, the height of the microbumps in an array is not uniform, while in some embodiments, the width of the microbumps in an array is not uniform, while in other embodiments the pitch of the microbumps in the array is not uniform.

Other embodiments 510 have an array of microbumps in the shape of peaked ridges 511 as schematically illustrated in FIG. 5C, or an array 520 of microbumps in the shape of flat-topped ridges 521 as schematically illustrated in FIG. 5D. The peaked ridges 511 and flat-topped ridges 521 each have a height 530 of about be 0.2 to 8 microns and a width 531 at the base of about 0.5 to 20 microns, and a pitch 532 of about 0.5 to 30 microns.

As such, a "microbump" is a protrusion extending from a surface and standing proud of the surface, which protrusion has a height of between 0.2 and 8 microns, and a width of between 0.5 and 20 microns. A microbump may take a variety of shapes, including shaped having cylindrical cross-section in a plane parallel to surface, flat-topped (having a rectangular cross-section in a plane normal to the plane of the surface), and peaked (having a triangular cross-section in a plane normal to the plane of the surface), and irregularly shaped, to name but a few.

Also, a "microbump" array (or "bump array") is an array of microbumps wherein all or almost all of the microbumps have a pitch of between 0.5 and 30 microns. The term "pitch" means the distance between the center of one microbump and the center of a neighboring microbump. For example, if the microbumps are pillars and each pillar has a circular cross-section defining a diameter, the pitch of the two microbumps includes the radius of each pillar plus the gap between the two pillars. An array of microbumps may be a microbump array even if it includes a few bumps that are taller or shorter than the "microbumps" described above, and/or if it includes a few bumps that have a pitch that is greater than or less than the pitch described above.

The low surface-free-energy layer is a surface treatment that, when applied to a microbump array, renders the microbump array superhydrophobic. For example, a non-superhydrphobic material may be considered to be a low surface-free-energy material if it produces a superhydrophobic surface when applied to a microbump array. Embodiments of low surface-free-energy materials may include a wafer-level CVD or PVD coating of fluorine, chlorine, methane or phenyl-based coating, to name but a few. The array in FIG. 5B is an STS etched silicon micro-pillar array with an FDTS (perflourodecyltrichlorosilane) coating. The water contact angle of the surface in FIG. 5B is approximately 140 to 160 degrees. The inventors have discovered that a combination of the microbump pillar array (the "microbumps") and the surface treatment (coating) produce an unexpected result: a superhydrophobic surface. The microbumps alone (i.e., without the coating) would not produce a superhydrophobic surface. Likewise, the surface treatment (coating) alone (i.e., without the microbumps) would not produce superhydrophobic surface. However, the combination of the microbumps and the surface treatment together has a synergistic effect; together they yield a superhydrophobic surface.

Figure 6A:
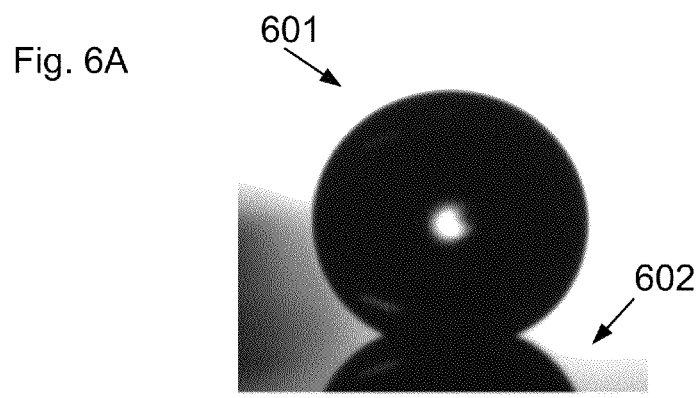
FIG. 6A is a photograph of a water drop on a superhydrophobic surface according to an embodiment.
Figure 6B:
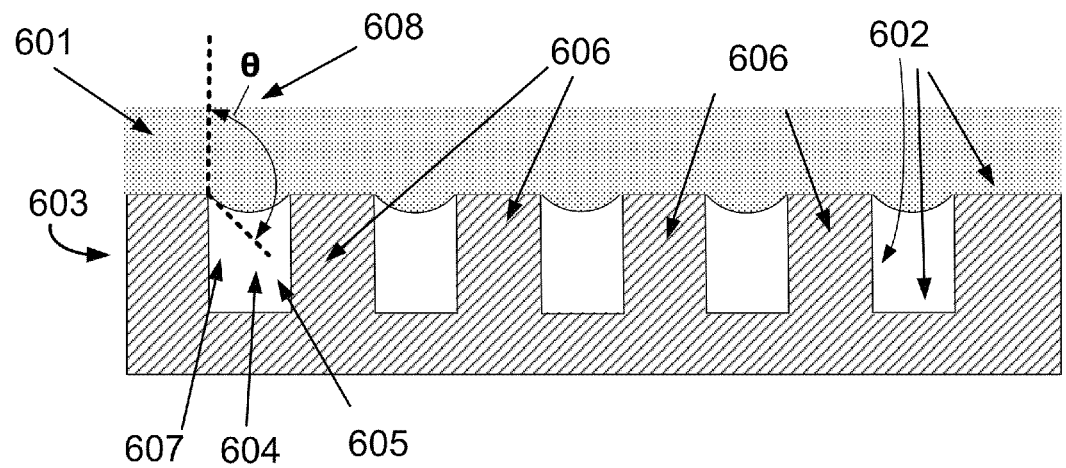
FIG. 6B schematically illustrates a layer of water on a superhydrophobic surface according to an embodiment.
Figure 6C:
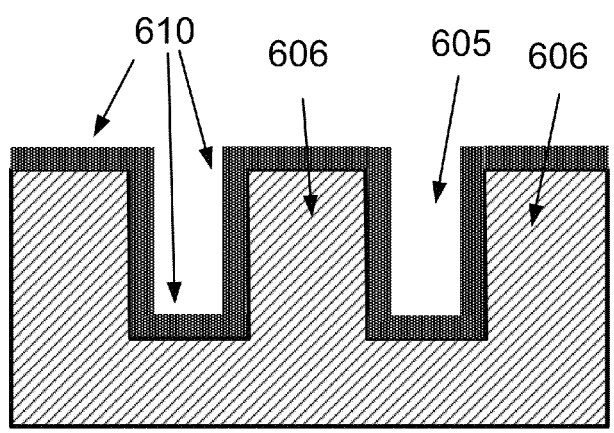
FIG. 6C schematically illustrates an array of bumps coated with a low surface-free-energy material.

A superhydrophobic surface has desirable liquid-repelling characteristics. For example, a drop of water 601 on a surface 602 of a substrate 603 in one embodiment is illustrated in FIG. 6A. A closer view of the interface with the drop of water 601 and the surface 602 is schematically illustrated in FIG. 6B, which shows that the spaces 605 between the microbumps is occupied by air, or other ambient gas. The liquid water 601 lies across the microbump array 603, and yet does not cover the entire surface 602 of the substrate 603. Rather, pockets 604 of ambient gas (which may be air, for example) fill the spaces 605 between the microbumps 606, resulting in a solid-liquid-gas (e.g., substrate-water-air) interface 607 with a superhydrophobic contact angle 608 (i.e., a contact angle of at least 140 degrees).

A closer view of a superhydrophobic microbump array reveals the lining of low surface-free-energy material 610 on the microbumps 606 and lining the surfaces 602 of the microbumps, and yet not filling the spaces 605 between the microbumps 605. Such a layer of low surface-free-energy material 610 may be described as "coating" the microbumps 606 or the array of microbumps 603, and may also be described as "lining" the microbumps 606 or the array of microbumps 603. More particularly, because the layer of low surface-free-energy material 610 conforms to the shape of the microbumps, that layer may be described as "conformally" coating the microbumps 606 or the array of microbumps 603.

Figure 3A:
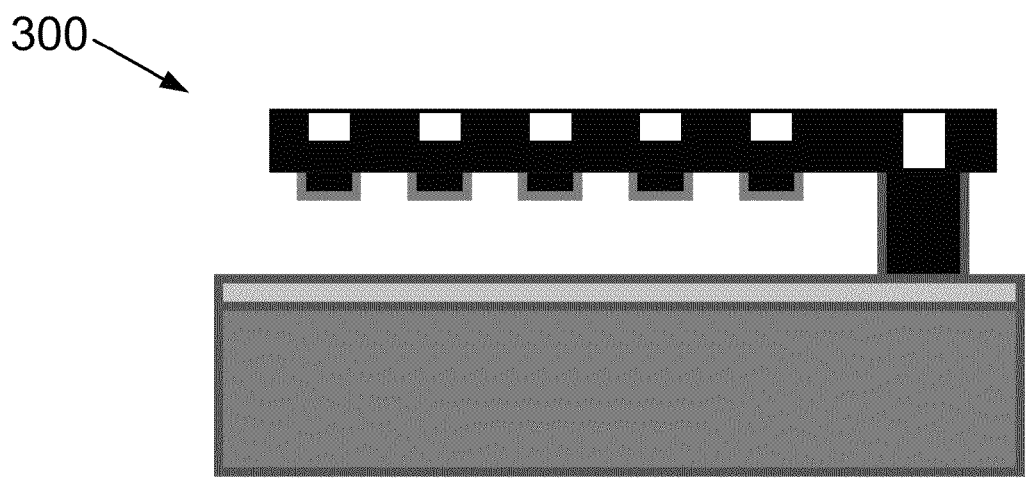
FIGS. 3A and 3B schematically illustrate cantilever accelerometers according to various embodiments.
Figure 3B:
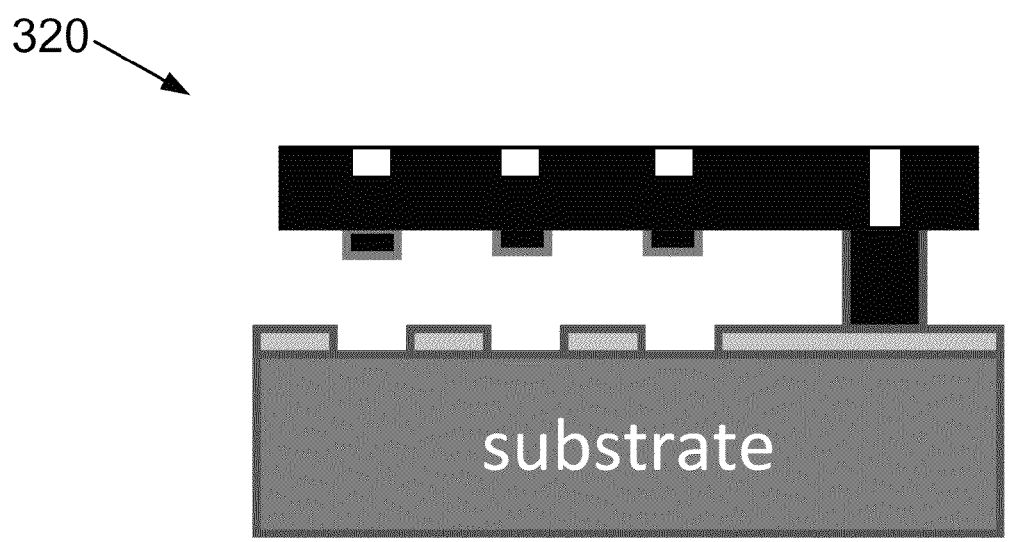

Embodiments of fabrication methods will be described below in connection with embodiments of cantilever-beam accelerometers 300 and 320, as schematically illustrated in FIG. 3A and FIG. 3B, for example, but could also be applied to other micromachined devices, such as microphones and gyroscopes.

Figure 7:
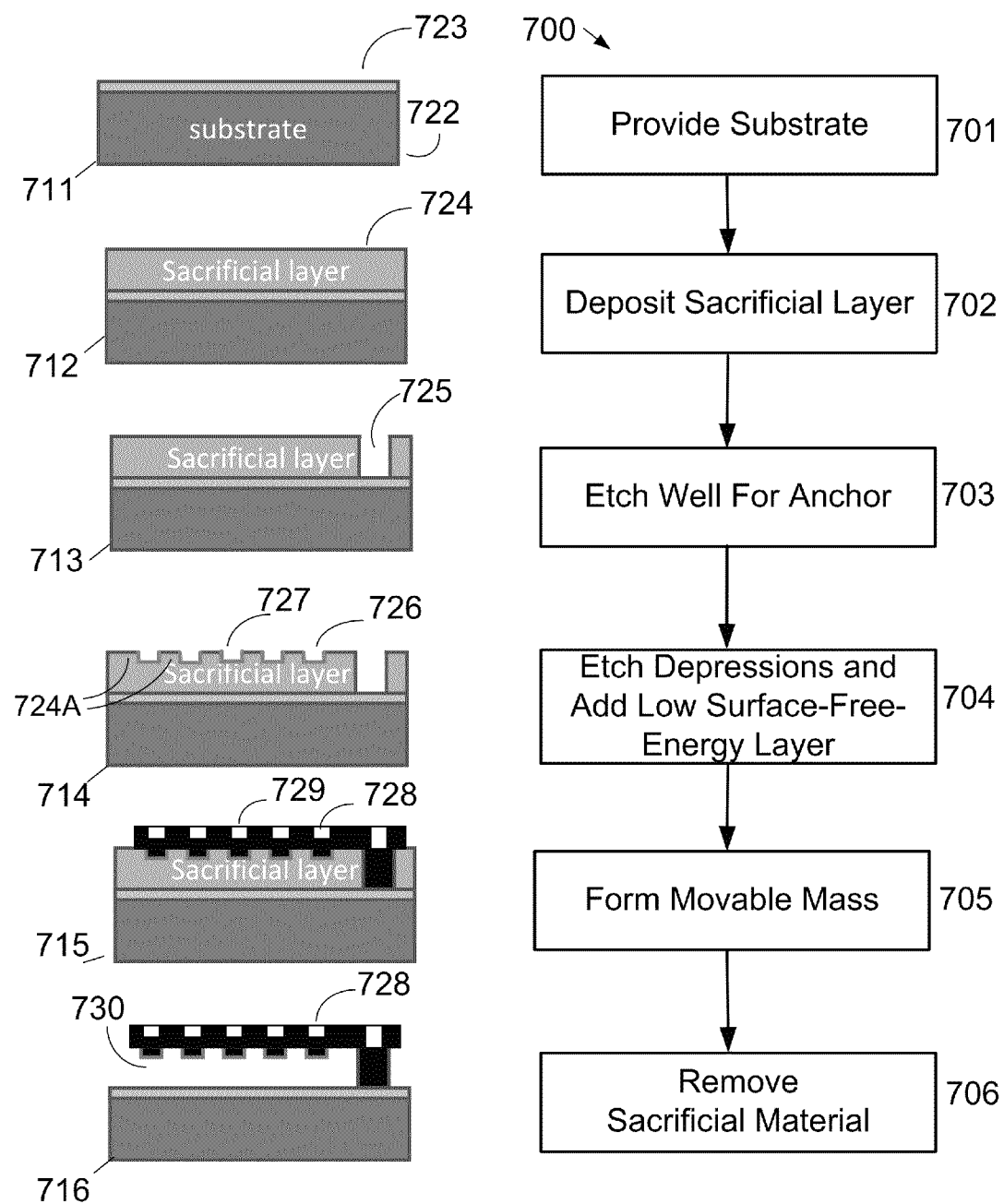
FIG. 7 is a flow chart to illustrate an embodiment of a method of fabrication of a cantilever accelerometer, along with schematic illustrations of the cantilever accelerometer at various stages of fabrication.

One embodiment of a method of fabricating a superhydrophobic surface on a beam of a cantilevered accelerometer is illustrated by FIG. 7, which includes a flow chart 700 and accompanying schematic illustrations 711 to 716. Step 701 provides a substrate 722, which may be a semiconductor wafer, a silicon-on-insulator wafer, or other material. The substrate 722 may optionally include a layer 723, such as a conductive or semiconductive layer, or an insulator layer, to name but a few examples.

At step 702, a sacrificial layer 724 is deposited on the substrate 722. The sacrificial layer 724 may be an oxide, for example.

A well 725 is then etched into the sacrificial layer 724 at step 703. The well 725 will later be filled with cantilever material, to form part of the cantilevered arm.

Trenches or depressions 726 are etched into the sacrificial layer 729 at step 704. In this embodiment, the dimensions of the depressions 726 are approximately the same as the dimension of the microbumps to be formed. In a sense, the depressions 726 are molds for the microbumps. If the microbump array is to include peaked microbumps, as schematically illustrated in FIG. 5C for example, the depressions may be formed by anisotropic etch. After the depressions are formed, a layer of low surface-free-energy material 727 is deposited on the sacrificial material to line the depressions 726 and cover portions 724A of the sacrificial material 724 between the depressions 726. The shape and volume of lined depressions 726 are now the same as the dimension of the microbumps to be formed.

The cantilevered beam 728 is formed by depositing a layer of cantilever material 729 at step 705. The cantilever material 729 may be polysilicon, for example, and may also be conductive. The cantilever material 729 covers the low surface-free-energy material 727 and thereby fills the lined depressions 726, and also fills the well 725.

Next, the sacrificial material 724 is removed at step 706. In effect, this releases the cantilever beam 728. Depending on the nature of the sacrificial material 729, it may be removed by a wet or a dry etch, for example. After the etch, the cantilever beam 728 is movable with respect to the substrate 722. In this embodiment, the lower surface 730 of the cantilever beam 728 (i.e., the surface of the beam that is opposite the substrate) is superhydrophobic.

Figure 8:
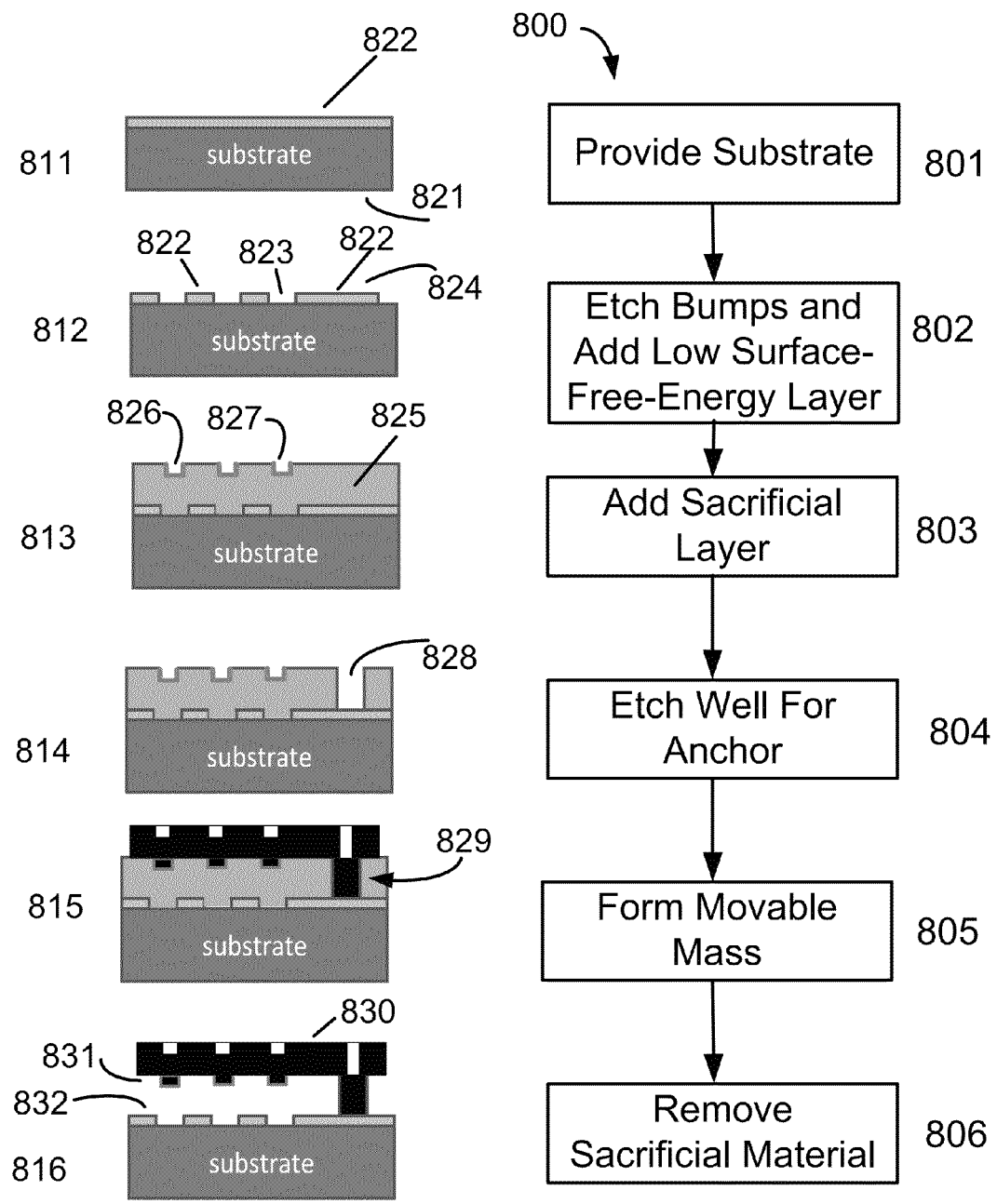
FIG. 8 is a flow chart to illustrate an embodiment of another method of fabrication of a cantilever accelerometer, along with schematic illustrations of the cantilever accelerometer at various stages of fabrication.

An alternate embodiment of a method of fabricating a superhydrophobic surface on a substrate of a cantilevered accelerometer, or optionally on both a beam and a substrate of a cantilevered accelerometer, is illustrated by FIG. 8, which includes a flow chart 800 and accompanying schematic illustrations 811 to 816.

The method 800 begins by providing a substrate 821 at step 801. The substrate in this embodiment has a substrate covering layer 822, although such a layer may not be present in other embodiments. In some embodiments, the substrate covering layer 822 may be low surface-free-energy material.

The substrate covering layer 822 is etched to form trenches or depressions 823 at step 802. The remaining material from the covering layer 822 then forms microbumps. Alternately, if the substrate 821 does not include a substrate layer (822), then the depressions could be etched into the substrate 821 itself. If the substrate, or a substrate covering layer 822, is not made of low surface-free-energy material, then—after the trenches or depressions 823 are formed—a layer of low surface-free-energy material 824 is deposited on the sacrificial material to line the depressions and cover the remaining portions of the substrate covering material. The remaining portions of the substrate covering material, which may be formed from or lined with low surface-free-energy material, are the microbumps of the microbump array.

A sacrificial material 825 is then deposited on the substrate at step 803, to cover the microbump array. Cavities or depressions 826 are etched into the sacrificial material 825, and are coated with a low surface-free-energy material 827. A well 828 is etched at step 804, and will later be filled with cantilever material to form an anchor 829 for the cantilevered beam 830. In steps 805 and 806, a cantilevered beam 830 is formed on the sacrificial material 825, and then released by removal of the sacrificial material. The process thus forms a superhydrophobic array on the cantilever beam 830, for example as described in connection with FIG. 7. In other embodiments, a cantilever beam 830 may be formed without a microbump array. The cantilever beam 830 in this embodiment 800 therefore has two superhydrophobic surfaces—the lower surface 831 of the cantilever beam 830 (i.e., the surface of the beam that is opposite the substrate) and the surface 832 of the substrate that is opposite the beam 830.

Although the embodiments in FIGS. 7 and 8 illustrate the fabrication of a cantilever beam accelerometer, the methods can be adapted to fabricate a variety of MEMS devices. Other embodiments of methods of forming superhydrophobic surfaces may be adapted to a variety of applications, including substrates, or the underside of the suspended beam of an accelerometer (such as surface 205 of beam 201 in FIG. 2B, for example), or the underside of a microphone diaphragm (such as surface 107 of diaphragm 101 in FIG. 1B, for example) to name but a few.

Figure 9:
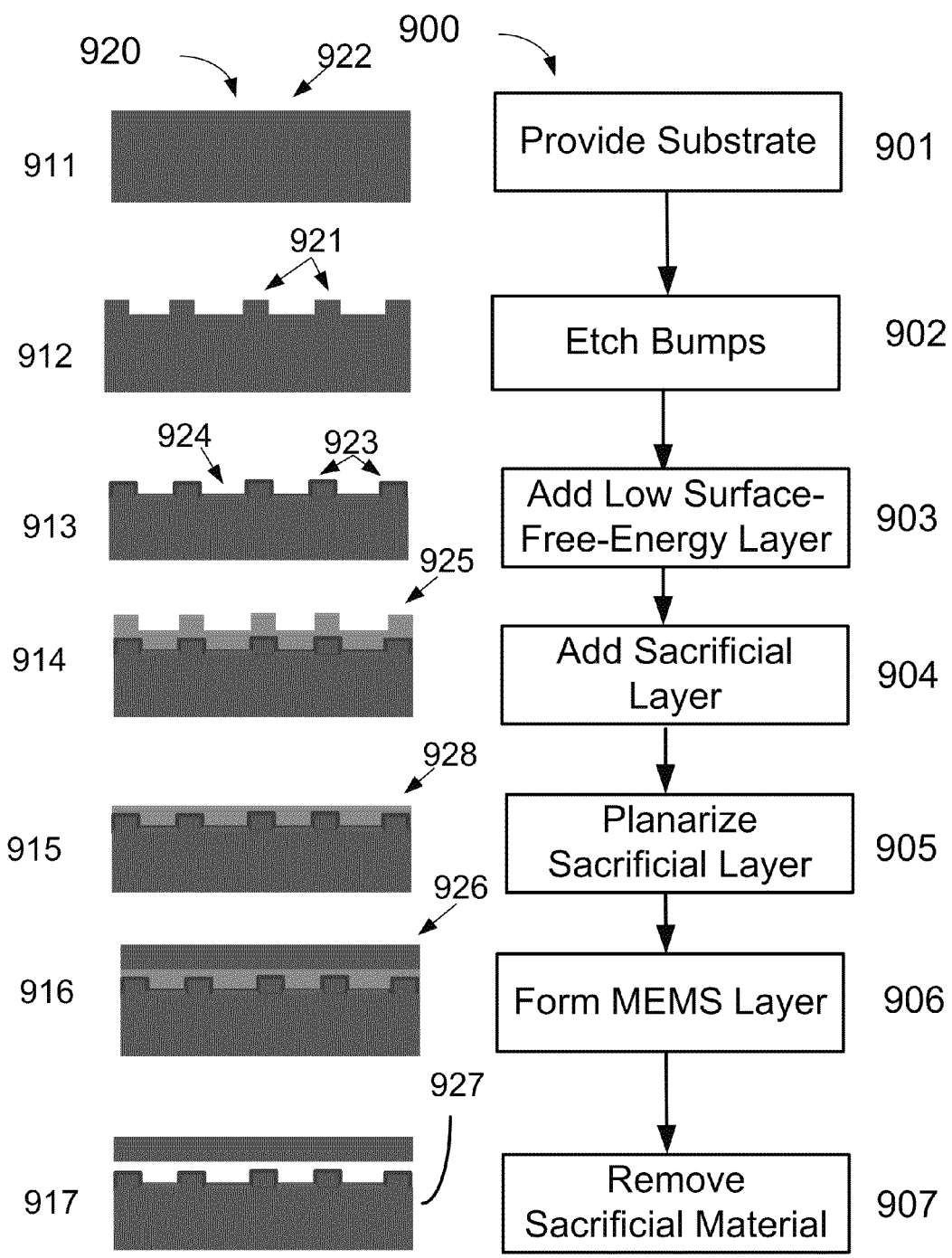
FIG. 9 is a flow chart to illustrate an embodiment of another method of fabrication of a MEMS device, along with schematic illustrations of the cantilever accelerometer at various stages of fabrication.

For example, an embodiment of a method of fabricating a superhydrophobic surface on a substrate of a MEMS device is illustrated by FIG. 9, which includes a flow chart 900 and accompanying schematic illustrations 911 to 917. The method begins provides a substrate 920 at step 901. Microbumps 921 are created by etching into a surface 922 of the substrate at step 902. The microbumps 921 have a variety of sizes, shapes and spacing, as described in several embodiments above.

In step 903, a low surface-free-energy layer 923 is added to the microbumped surface 922. The low surface-free-energy layer coats the bumps 921 and the spaces 924 between the bumps 921. In some embodiments, the low surface-free-energy layer 923 conforms to the contour of (i.e., it is conformal with) the microbumps 921 and spaces 924 between the microbumps bumps. Later, the low surface-free-energy layer will be part of the superhydrophobic surface.

Next, a sacrificial layer 925 is added at step 904. The sacrificial layer 925 covers the microbumps 921 and fills the spaces 924 between the microbumps 921. The sacrificial layer 925 creates a gap between the microbumps 921 and a MEMS structure layer 926 to be added in step 906. In other words, the sacrificial layer 925 will be sandwiched between the microbumps 921 and the surface containing the microbumps 921, and MEMS layer 926.

The sacrificial layer 925 is planarized at step 905, and then the MEMS structure layer 926 is added to the planarized surface of the sacrificial layer 925 at step 906. The MEMS structure layer 926, when released, may be a MEMS structure, such as the movable beam of an accelerometer, or a microphone diaphragm, for example.

Thereafter, the sacrificial material 925 is removed to expose the superhydrophobic microbumped surface 927. In some embodiments, the step of removing the sacrificial material also releases a MEMS structure formed by the MEMS layer.

Figure 10A:
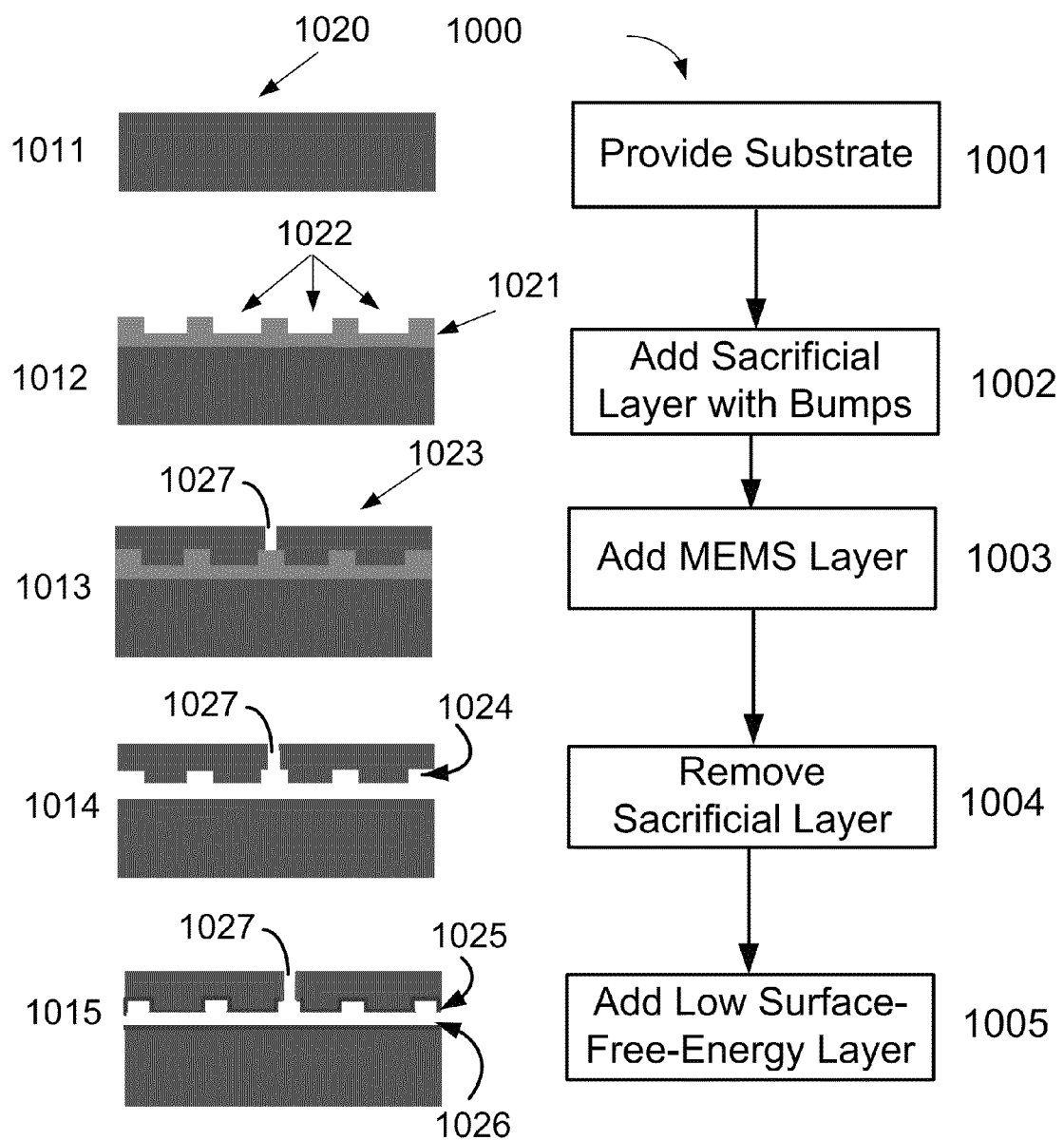
FIG. 10A is a flow chart to illustrate an embodiment of another method of fabrication of a MEMS device, along with schematic illustrations of the cantilever accelerometer at various stages of fabrication.

While some embodiments add a low surface-free-energy layer on an exposed surface, such as the surface of a substrate as in FIG. 9, or the surface of a sacrificial layer as in FIG. 7, for example, other embodiments form the MEMS structure prior to adding a low surface-free-energy layer. For example, an embodiment of a method of forming a MEMS device with a superhydrophobic surface is illustrated by FIG. 10A, which includes a flow chart 1000 and accompanying schematic illustrations 1011 to 1015. The method provides a substrate 1020 at step 1001. A sacrificial layer 1021 is added and etched at step 1002, to form an array of cavities 1022.

At step 1003, a MEMS structure layer 1023 is added. The MEMS structure layer 1023 covers the sacrificial layer 1021, and occupies or fills the cavities 1022. The portion of the MEMS structure layer 1023 that occupies the cavities 1022 will form an array of microbumps that form part of a superhydrophobic surface. Indeed, at later step (step 1004), the sacrificial material 1021 is removed to expose an array of microbumps 1024 on the MEMS structure layer 1023. The microbumps 1024 have shapes, dimensions and spacing as described above. As such, the cavities 1022 act as a mold for the array of microbumps.

Some embodiments include the formation of a hole (or "aperture" or "passage") 1027 through the MEMS structure layer 1023 at step 1003, for example by patterning the MEMS structure layer 1023. In embodiments with such a hole, the hole may be used for the later application of a low surface-free-energy material. For example, the MEMS structure layer 1023 in FIG. 10A includes such a hole 1027 through the MEMS structure layer 1023, which is discussed below in connection with the step that adds the low surface-free-energy material.

Yet later, a low surface-free-energy material is added to the microbumped surface 1025 of the MEMS structure layer 1023 and to the exposed surface 1026 of the substrate 1020 (step 1005). As such, the microbumped surface 1025 of the MEMS structure layer 1023 is rendered superhydrophobic. In some embodiment, the low surface-free-energy material may be supplied between the substrate and the MEMS layer by introducing a low surface-free-energy material as a gas via the hole 1027. In other embodiments, gaseous low surface-free-energy material may be supplied without such a hole or holes, for example if the gap between the substrate 1070 and the MEMS layer 1074 is accessible from another direction, such as through the substrate 1070 for example. In any event, the low surface-free-energy material coats the surfaces of the substrate and MEMS layer within the gap.

Figure 10B:
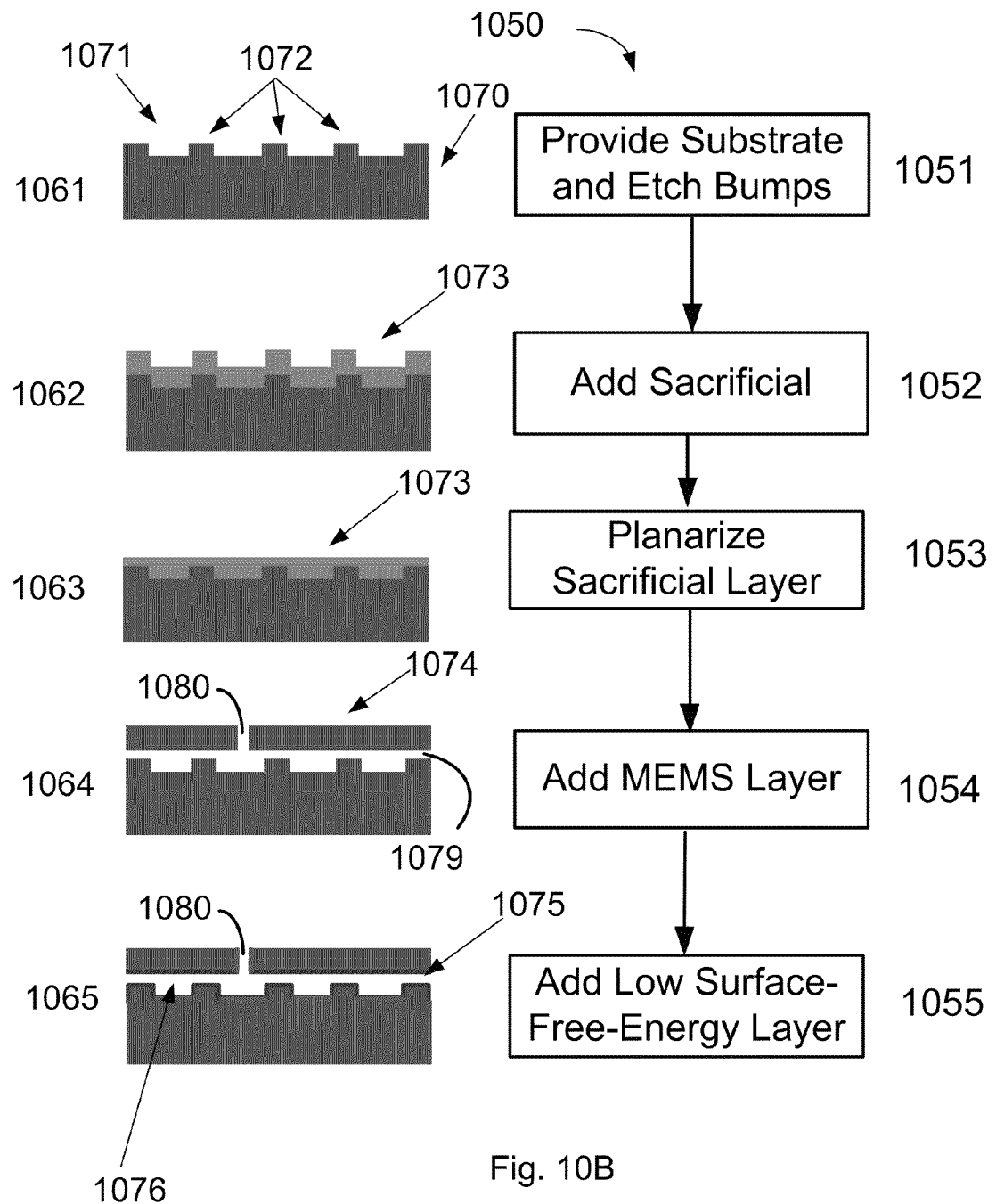
FIG. 10B is a flow chart to illustrate an embodiment of another method of fabrication of a MEMS device, along with schematic illustrations of the device at various stages of fabrication.

An alternate embodiment of a method of forming a MEMS device with a superhydrophobic surface is illustrated by FIG. 10B, which includes a flow chart 1050 and accompanying schematic illustrations 1061 to 1065. The method provides a substrate 1070 at step 1051. A surface 1071 of the substrate 1070 is etched to form an array of microbumps 1072, which array has microbumps 1072 of shapes, dimensions and spacing as described above.

A sacrificial layer 1073 is added to the microbumped surface 1071 of the substrate 1070 at step 1052, and the sacrificial layer 1073 is planarized at step 1053. Afterwards, and MEMS layer 1074 is added to the planarized sacrificial layer 1073 at step 1054, with the result that the sacrificial layer is sandwiched between the bumped surface 1071 of the substrate 1070 and the MEMS layer 1074. Some embodiments form one or more holes or passages 1080 in the MEMS layer 1074, which may be used for the application of a low surface-free-energy layer.

Then, as also illustrated within step 1054, the sacrificial layer 1073 is removed to expose the microbumped surface 1071 of the substrate 1070, and a surface 1076 of the MEMS layer 1074.

In step 1055, a low surface-free-energy material is added to the exposed microbumped surface 1071 of the substrate 1070, and surface 1076 of the MEMS layer 1074. In some embodiments, the low surface-free-energy material may be supplied as a gas to the gap 1079 between the substrate 1070 and the MEMS layer 1074. For example, the low surface-free-energy material may be introduced via one or more holes 1080. In some embodiments, the low surface-free-energy material may conformally coat the microbumped surface 1075. The microbumped surface 1075 is thereby rendered superhydrophobic.

Embodiments of superhydrophobic surfaces, and methods of fabricating such surfaces, may also apply to surfaces that are normal to the intended or possible direction of movement, such as the surfaces 203A or 204A of fingers 203 or 204 in FIG. 2A, for example. In some embodiments, microbumps may be formed on the fingers at the same time, and using similar methods, as the fingers are formed, and a low surface-free-energy layer or coating applied to the microbumps.

Figure 11A:
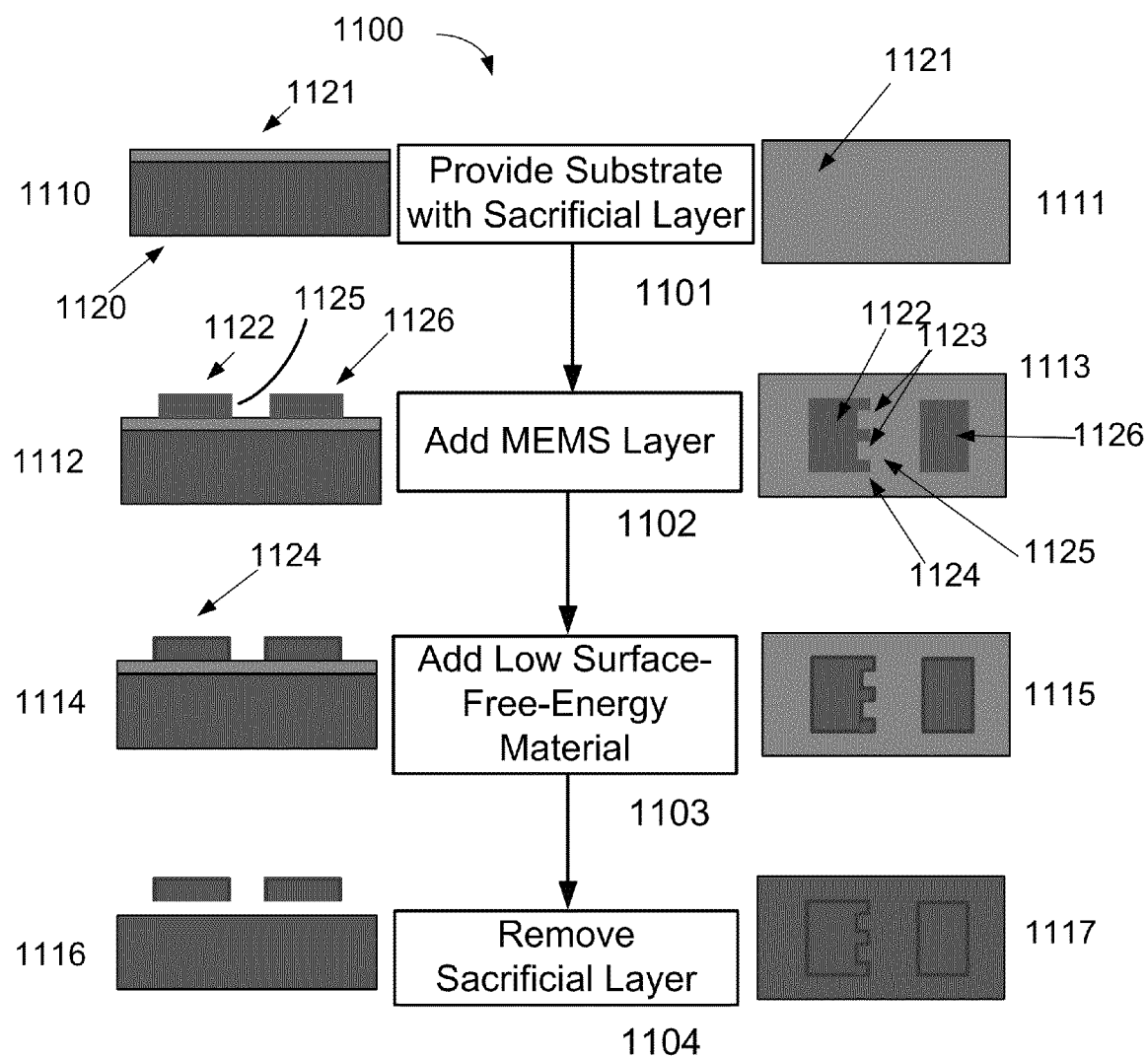
FIG. 11A is a flow chart to illustrate an embodiment of another method of fabrication of a MEMS device, along with schematic illustrations of the device at various stages of fabrication.

For example, and embodiment of a method of fabricating a superhydrophobic surface on a side of a movable MEMS element is illustrated by FIG. 11A, which includes a flow chart 1100 and accompanying schematic illustrations 1110 to 1117.

The method 1100 provides a substrate 1120 at step 1101. An embodiment of a substrate 1120 is schematically illustrated in a profile view 1110, and top view 1111. In this embodiment, the substrate 1120 includes a sacrificial layer 1121, but other embodiments may include adding a sacrificial layer 1121 to the substrate 1120.

One or more MEMS structures 1122 are then added onto the sacrificial layer 1121 at step 1102. The MEMS structure 1122 includes an array of microbumps 1123, the microbumps 1123 extend parallel to the substrate 1120 from a surface of the MEMS structure 1122 that is perpendicular to the substrate 1120. The microbumps 1123 form a microbump array which has microbumps of shapes, dimensions and spacing as described above.

Step 1103 adds a low surface-free-energy material 1124 to the MEMS structure 1122. The low surface-free-energy material 1124 covers at least the microbumped surface 1125 of the MEMS structure. In other words, the low surface-free-energy material 1124 covers the "side" surface of the MEMS structure 1122, and that surface 1125 is thereby rendered superhydrophobic. As a practical matter the low surface-free-energy material 1124 may cover all of the exposed surface of the MEMS structure 1122, other structure 1126, and the exposed surface of sacrificial material 1121. The low surface-free-energy material 1124 may interfere with the removal of sacrificial material 1121, and so some embodiments include the removal of the low surface-free-energy material 1124 from at least the sacrificial material 1121. Such removal may be accomplished, for example, by masking (i.e., depositing a mask layer) on the portion of low surface-free-energy material 1124 to be retained, removing the low surface-free-energy material not covered by the mask, and then removing the mask layer. As such, at least the sacrificial material 1121 is free of low surface-free-energy material 1124. As shown in illustrations 1114 and 1115, the low surface-free-energy material 1124 coats only the surfaces of MEMS structure 1122 and other structure 1126.

The method 1100 also removes the sacrificial material 1121, which in this embodiment releases the MEMS structure 1122. The MEMS structure 1122 is therefore movable with respect to the substrate 1120. In some embodiments, the MEMS structure 1122 may move parallel to the substrate 1120—i.e., in a direction normal to the side 1125 of the MEMS structure 1122 described above. If that side 1125 of the MEMS structure 1122 faces another structure, such as structure 1126 for example, then the motion of the MEMS structure may incur a risk of stiction with respect to the other structure 1126. The superhydrophobic surface 1125 on the side of the MEMS structure 1122 tends to mitigate that risk.

Figure 11B:
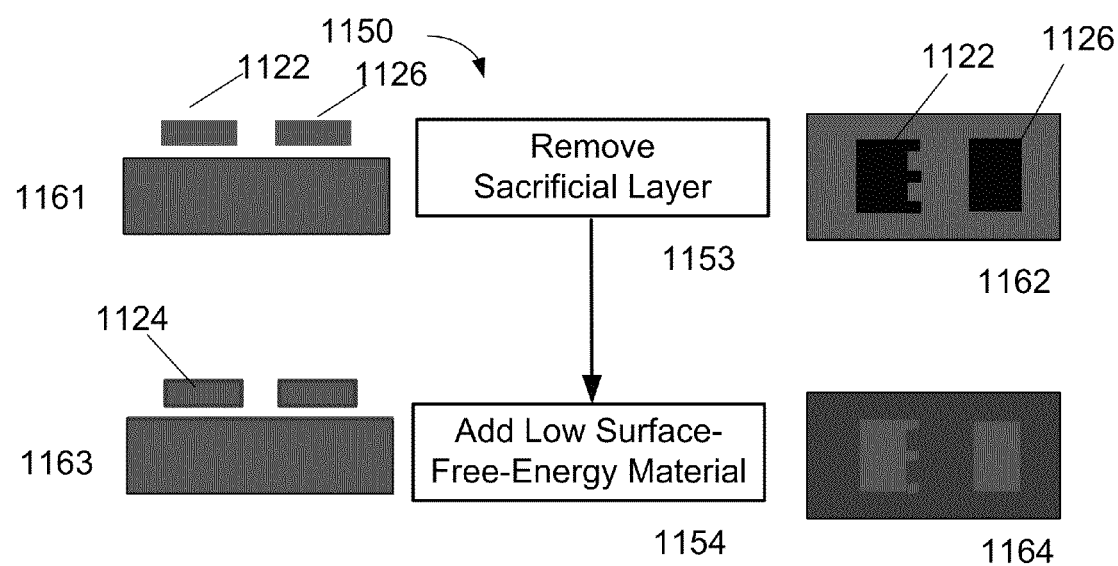
FIG. 11B is a flow chart to illustrate an embodiment of another method of fabrication of a MEMS device, along with schematic illustrations of the device at various stages of fabrication.

Some embodiments remove the sacrificial layer before adding the low surface-free-energy material, as illustrated in FIG. 11B, for example. The method 1150 of 11B begins with the steps 1101 and 1102 as described in connection with FIG. 11A. However, in the method 1150, the sacrificial material 1121 is removed at step 1153, before adding the low surface-free-energy material 1124 at step 1154. As such, the low surface-free-energy material 1124 may also cover some or all of the substrate 1120. Such residual low surface-free-energy material 1124 on the substrate 1120 is generally harmless, but may be removed.

The embodiments of the invention described above are intended to be merely exemplary; numerous variations and modifications will be apparent to those skilled in the art. All such variations and modifications are intended to be within the scope of the present invention as defined in any appended claims.

What is claimed is:

1. A method of fabricating a micromachined device having a superhydrophobic surface, the method comprising:
   providing a substrate having a first surface;
   providing an array of bumps on the first surface;
   adding a low surface-free-energy layer to the array, such that the low surface-free-energy layer coats the bumps but does not fill the space between the bumps;
   adding a sacrificial layer on the low surface-free-energy layer, the sacrificial layer having an exposed surface;
   depositing a mass layer on the exposed surface of the sacrificial layer such that the sacrificial layer is sandwiched between the substrate and an opposing surface of the mass layer; and
   removing the sacrificial layer, thereby exposing the coated array,
   wherein the bumps of the array protrude from the substrate in the direction of the opposing surface of the mass layer, and wherein the array has a contact angle of at least 140 degrees and a contact angle hysteresis of less than 15 degrees.

2. The method of fabricating a micromachined device having a superhydrophobic surface of claim 1, wherein the array of bumps comprises a plurality of bumps having a pitch of between 0.5 microns and 30 microns, and each bump having a height of at least 0.2 microns and width of at least 0.5 microns.

3. The method of fabricating a micromachined device having a superhydrophobic surface of claim 1, wherein adding a low surface-free-energy layer to the array comprises adding a material selected from the group of fluorine, chlorine, methane, a phenyl-based material, and a perflourodecyltrichlorosilane material.

4. The method of fabricating a micromachined device having a superhydrophobic surface of claim 1, the method further comprising, before depositing a mass layer on the exposed surface of the sacrificial layer:
   etching an array of cavities into the exposed surface of the sacrificial layer;
   depositing a second layer of low surface-free-energy material to the array of cavities, the low surface-free-energy material lining but not filling the cavities in the array of cavities such that the cavities are lined cavities,
   wherein depositing the mass sandwiches the sacrificial layer and the second low surface-free-energy layer between the substrate and an opposing surface of the mass layer, the mass layer occupying the plurality of lined cavities and forming a plurality of bumps, and wherein removing the sacrificial layer exposes an array of bumps coated with the second low surface-free-energy material.

* * * * *